US010448536B2

(12) United States Patent
Dlugosz

(10) Patent No.: US 10,448,536 B2
(45) Date of Patent: Oct. 15, 2019

(54) PORTABLE RACK DOLLY, RETROFIT KIT AND METHODS OF USE

(71) Applicant: Aviat U.S., Inc., Milpitas, CA (US)

(72) Inventor: Farley Dlugosz, San Antonio, TX (US)

(73) Assignee: Aviat U.S., Inc., Milpitas, CA (US)

( * ) Notice: Subject to any disclaimer, the term of this patent is extended or adjusted under 35 U.S.C. 154(b) by 0 days.

(21) Appl. No.: 16/218,106

(22) Filed: Dec. 12, 2018

(65) Prior Publication Data

US 2019/0200477 A1     Jun. 27, 2019

Related U.S. Application Data

(60) Provisional application No. 62/598,991, filed on Dec. 14, 2017.

(51) Int. Cl.
    *H05K 7/18*      (2006.01)
    *A47B 91/00*      (2006.01)
    *B62B 1/10*      (2006.01)
    *H04Q 1/02*      (2006.01)

(52) U.S. Cl.
    CPC ........... *H05K 7/186* (2013.01); *A47B 91/002* (2013.01); *B62B 1/10* (2013.01); *H04Q 1/09* (2013.01)

(58) Field of Classification Search
    CPC ........ H05K 5/0234; H05K 7/186; B62B 1/10; B62B 1/12; B62B 1/20; B62B 5/0083; B62B 1/206; A47B 91/002
    USPC ........................................................ 16/29
    See application file for complete search history.

(56) References Cited

U.S. PATENT DOCUMENTS

| | | | | | |
|---|---|---|---|---|---|
| 1,341,171 | A | * | 5/1920 | Hall ........................ | B62B 1/12 280/47.12 |
| 2,697,243 | A | * | 12/1954 | Shager ................... | D05B 75/02 16/33 |
| 2,710,106 | A | * | 6/1955 | Hanson ................... | B62B 1/264 414/456 |
| 2,922,487 | A | * | 1/1960 | Reitknecht .............. | E06C 1/397 182/16 |

(Continued)

FOREIGN PATENT DOCUMENTS

DE      102013000782      7/2014

OTHER PUBLICATIONS

International Application No. PCT/US2018/065268, International Search Report and Written Opinion dated Mar. 8, 2019.

*Primary Examiner* — Patrick D Hawn
(74) *Attorney, Agent, or Firm* — Sheppard, Mullin, Richter & Hampton LLP

(57) ABSTRACT

A system comprises a wheel assembly including a wheel shaft and first and second wheels rotationally coupled to the wheel shaft; a first bracket coupled to a device rack and including a first open slot, the first open slot including a receiving portion configured to receive the wheel shaft at a first position, a delivery portion configured to deliver the wheel shaft upon tilting the rack forwards, and a locking portion configured to secure the wheel shaft upon tilting the rack backwards; and a second bracket configured to be coupled to the rack on a second side and including a second open slot, the second open slot including a receiving portion configured to receive the wheel shaft at a second position, a delivery portion configured to deliver the wheel shaft upon tilting the rack forwards, and a locking portion configured to secure the wheel shaft upon tilting the rack backwards.

18 Claims, 9 Drawing Sheets

(56) References Cited

U.S. PATENT DOCUMENTS

| | | | |
|---|---|---|---|
| 4,226,434 A * | 10/1980 | Hill | B62B 1/12 280/47.21 |
| 4,253,546 A * | 3/1981 | Uchida | B62B 1/12 182/20 |
| 4,748,715 A * | 6/1988 | Rice | B60B 33/06 16/19 |
| 5,188,381 A * | 2/1993 | Kho | A45C 5/143 190/18 A |
| 5,427,393 A * | 6/1995 | Kriebel | B62B 1/14 280/47.131 |
| 5,457,849 A * | 10/1995 | Branson | B60B 33/04 16/19 |
| 5,489,107 A * | 2/1996 | Kho | A45C 5/143 190/18 A |
| 5,566,780 A * | 10/1996 | Bambrough | A01M 31/02 182/116 |
| 5,669,659 A | 9/1997 | Dittmer | |
| 5,924,168 A * | 7/1999 | Webb | A47B 47/021 16/30 |
| 6,148,971 A * | 11/2000 | Kho | A45C 5/14 190/115 |
| 6,161,861 A * | 12/2000 | Ivie | B62B 5/0083 16/30 |
| 6,254,112 B1 | 7/2001 | Clegg | |
| 6,273,438 B1 * | 8/2001 | Prapavat | B62B 1/002 280/47.2 |
| 6,328,330 B1 | 12/2001 | Haaser | |
| 6,364,328 B1 * | 4/2002 | Stahler, Sr. | B62B 1/002 280/47.18 |
| 6,460,867 B2 * | 10/2002 | Sciulli | B62B 1/12 280/47.26 |
| 6,474,930 B1 * | 11/2002 | Simpson | A01B 73/00 269/17 |
| 7,036,631 B2 | 5/2006 | Feik | |
| 7,914,017 B2 * | 3/2011 | Setzer, Sr. | B62B 1/10 280/47.17 |
| 8,100,430 B2 * | 1/2012 | Meyers | B62B 1/002 280/30 |
| 8,292,309 B2 * | 10/2012 | Fan | B60B 37/10 280/43.14 |
| 8,336,719 B2 * | 12/2012 | Fan | H05K 7/1488 211/13.1 |
| 8,418,315 B1 * | 4/2013 | Lin | B60B 33/0084 16/35 D |
| 8,465,046 B2 * | 6/2013 | Meyers | B62B 1/002 280/30 |
| 8,544,860 B2 * | 10/2013 | Fan | H05K 7/1488 108/158.12 |
| 8,985,345 B2 * | 3/2015 | Fan | H05K 7/18 211/26 |
| 9,556,675 B2 * | 1/2017 | Reyes | E06C 9/08 |
| 10,189,419 B2 * | 1/2019 | Billard | B62B 5/0003 |
| 10,233,056 B1 * | 3/2019 | Brauer | B62B 3/06 |
| 10,357,104 B2 * | 7/2019 | Jost | H05K 7/1401 |
| 2002/0172013 A1 * | 11/2002 | Chandler | H02B 1/301 361/724 |
| 2003/0091417 A1 * | 5/2003 | Swann | B62B 5/0083 414/458 |
| 2004/0174105 A1 * | 9/2004 | Hung | A47B 91/02 312/351.1 |
| 2008/0061522 A1 * | 3/2008 | Zimmermann | B62B 5/0083 280/47.12 |
| 2009/0129905 A1 * | 5/2009 | McIntosh | B62B 3/04 414/471 |
| 2012/0013092 A1 * | 1/2012 | Fan | H05K 7/1488 280/79.3 |
| 2012/0062084 A1 * | 3/2012 | Lewis, II | H05K 5/0234 312/223.6 |
| 2013/0312295 A1 * | 11/2013 | Celli | B62B 1/002 37/266 |
| 2015/0204139 A1 | 7/2015 | Landers | |

\* cited by examiner

PORTABLE RACK DOLLY, RETROFIT KIT AND METHODS OF USE

CROSS-REFERENCE TO RELATED APPLICATIONS

This application claims benefit of and hereby incorporates by reference U.S. Provisional Patent Application Ser. No. 62/598,991, entitled "Portable Rack Dolly," filed on Dec. 14, 2017, by inventor Farley Dlugosz.

TECHNICAL FIELD

This invention relates generally to dolly carts, and more particularly provides a portable rack dolly, retrofit kit and methods of use.

BACKGROUND

Moving rack-mounted systems is cumbersome. Installers typically use shipping support brackets to walk racks from outside a shelter to inside the shelter. It would be helpful to have a solution to more easily move rack-mount systems without large bulky moving equipment.

SUMMARY

In some embodiments, a system is configured to modify a device rack into a portable rack dolly. The system comprises a wheel assembly, the wheel assembly including a wheel shaft, a first wheel rotationally coupled to the wheel shaft, and a second wheel rotationally coupled to the wheel shaft, the wheel shaft including a first shaft position and a second shaft position; a first bracket configured to be coupled to a device rack on a first side at a first low position, the first bracket including a first open slot configured to cooperate with the first shaft position on the wheel shaft, the first open slot including a first receiving portion configured to receive the wheel shaft at the first shaft position, a first delivery portion configured to deliver the wheel shaft upon tilting the device rack forwards, and a first locking portion configured to secure the wheel shaft upon tilting the device rack backwards; and a second bracket configured to be coupled to the device rack on a second side at a second low position, the second bracket including a second open slot configured to cooperate with the second shaft position on the wheel shaft, the second open slot including a second receiving portion configured to receive the wheel shaft at the second shaft position, a second delivery portion configured to deliver the wheel shaft upon tilting the device rack forwards, and a second locking portion configured to secure the wheel shaft upon tilting the device rack backwards.

In some embodiments, the wheel shaft may include a first groove at the first shaft position configured to engage with the first open slot, and a second groove at the second shaft position configured to engage with the second open slot. A distance between the first groove and the second groove may be the same as a distance between the first bracket and the second bracket when affixed to the device rack. Each of the first receiving portion and the second receiving portion may include an initial portion of the first open slot and the second open slot, respectively. Each of the first delivery portion and the second delivery portion may include a downwardly angled portion configured to allow gravity to drop the wheel shaft downward as the device rack is tilted forwards. The downwardly angled portion may include a curved portion. Each of the first locking portion and the second locking portion may include a horizontal or upwardly angled portion configured to allow the weight of the device rack to secure the wheel shaft as the device rack is tilted backwards. The horizontal or upwardly angled portion may include a curved portion. The system may include a handle assembly coupled to the device rack, the handle assembly being configured to support tilting the device rack forwards and backwards. The handle assembly may include a first handle assembly attached to a first post and a second handle assembly attached to a second post. The device rack may include telecommunication equipment. The height of the first receiving portion and the second receiving portion may be about the same as the height of the wheel shaft. The first bracket may include a first gusset bracket and the second bracket may include a second gusset bracket.

In some embodiments, the present invention provides a portable rack dolly system. The portable rack dolly system includes a device rack with a first post having a top end and a bottom end, a second post having a top end and a bottom end, a first crossbar attached across the first post and the second post, and a base attached to the bottom end of the first post and the bottom end of the second post, the base configured to maintain the device rack in a stable upright position; a wheel assembly, the wheel assembly including a wheel shaft, a first wheel rotationally coupled to the wheel shaft, and a second wheel rotationally coupled to the wheel shaft, the wheel shaft including a first shaft position and a second shaft position a first bracket configured to be coupled to the device rack on a first side at a first low position, the first bracket including a first open slot configured to cooperate with the first shaft position on the wheel shaft, the first open slot including a first receiving portion configured to receive the wheel shaft at the first shaft position, a first delivery portion configured to deliver the wheel shaft upon tilting the device rack forwards, and a first locking portion configured to secure the wheel shaft upon tilting the device rack backwards; and a second bracket configured to be coupled to the device rack on a second side at a second low position, the second bracket including a second open slot configured to cooperate with the second shaft position on the wheel shaft, the second open slot including a second receiving portion configured to receive the wheel shaft at the second shaft position, a second delivery portion configured to deliver the wheel shaft upon tilting the device rack forwards, and a second locking portion configured to secure the wheel shaft upon tilting the device rack backwards.

In some embodiments, the wheel shaft may include a first groove at the first shaft position configured to engage with the first open slot, and a second groove at the second shaft position configured to engage with the second open slot. Each of the first delivery portion and the second delivery portion may include a downwardly angled portion configured to allow gravity to drop the wheel shaft downward as the device rack is tilted forwards. Each of the first locking portion and the second locking portion may include a horizontal or upwardly angled portion configured to allow the weight of the device rack to secure the wheel shaft as the device rack is tilted backwards. The portable rack dolly system may include a handle assembly coupled to the device rack, the handle assembly being configured to support tilting the device rack forwards and backwards. The handle assembly may include a first handle assembly attached to the first post and a second handle assembly attached to the second post. The height of the first receiving portion and the second receiving portion may be about the same as the height of the wheel shaft.

DETAILED DESCRIPTION

The following description is provided to enable a person skilled in the art to make and use various embodiments of the invention. Modifications are possible. The generic principles defined herein may be applied to the disclosed and other embodiments without departing from the spirit and scope of the invention. The claims are not intended to be limited to the embodiments disclosed, but are to be accorded the widest scope consistent with the principles, features and teachings herein.

Figure 1A:
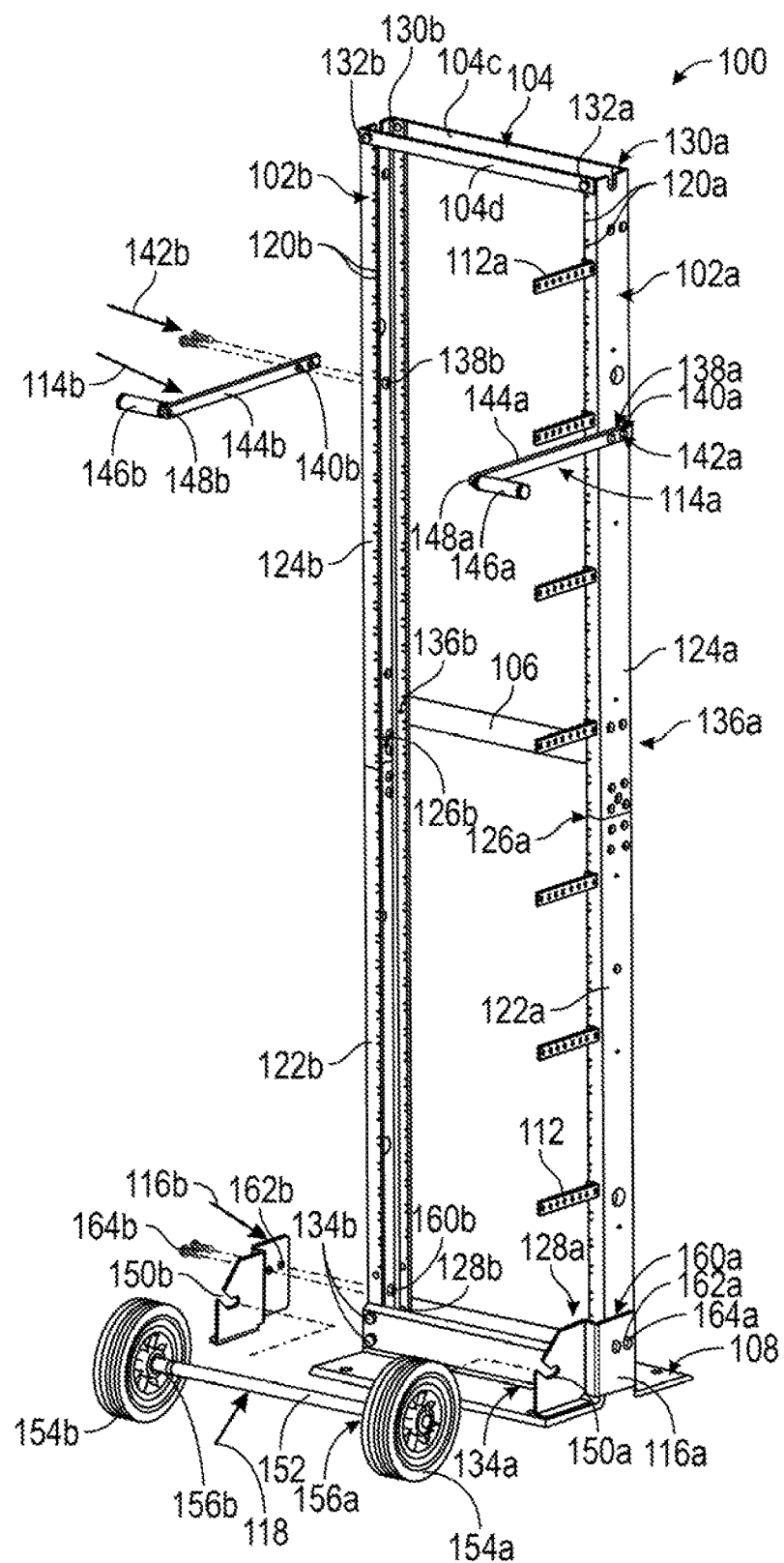
FIG. 1A depicts a portable rack dolly system, in accordance with an embodiment of the present invention.

FIG. 1A depicts a portable rack dolly system 100, in accordance with an embodiment of the present invention. The portable rack dolly system 100 includes a first post 102a, a second post 102b, one or more top crossbars 104, one or more intermediate crossbars 106, a base 108, one or more component support rails 112, a first handle assembly 114a, a second handle assembly 114b, a first gusset bracket 116a, a second gusset bracket 116b, and a wheel assembly 118. In some embodiments, the first handle assembly 114a, the second handle assembly 114b, the first gusset bracket 116a, the second gusset bracket 116b and the wheel assembly 118 make up a retrofit kit configured to retrofit, upgrade and/or otherwise modify a device rack (e.g., a rack mount system with or without components thereon) to create the portable rack dolly system 100.

For convenience, the element character "a" is being used to refer to elements involving the first post 102a (or the right side of FIG. 1), and the element character "b" is being used to refer to elements involving the second post 102b (or the left side of FIG. 1). Similarly, the element character "c" is being used to refer to elements involving the front of the portable rack dolly system 100, and the element character "d" is being used to refer to elements involving the rear of the portable rack dolly system 100.

The first post 102a includes a single vertical support member or multiple vertical support members coupled together. As shown in FIG. 1, the first post 102a includes a lower vertical support member 122a and an upper vertical support member 124a coupled together using an attachment mechanism 126a (hidden due to the perspective view, but in some embodiments including a mirror image of the attachment mechanism 126b on the second post 102b). The attachment mechanism 126a may include an attachment bracket affixed to the lower vertical support member 122a and to the upper vertical support member 124a using screws, bolts (e.g., shipping bolts), nuts and bolts, welding, etc. In some embodiments, the lower vertical support member 122a and the upper vertical support member 124a may be attached to each other without a bracket 126a, e.g., via welding, bolts (e.g., shipping bolts), nuts and bolts, screws, etc. In some embodiments, the lower vertical support member 122a and the upper vertical support member 124a may be shaped to slideably engage within each other to increase and/or decrease the height of the portable rack dolly system 100.

The second post 102b includes a single vertical support member or multiple vertical support members coupled together. As shown in FIG. 1, the second post 102b includes a lower vertical support member 122b and an upper vertical support member 124b coupled together using an attachment mechanism 126b. The attachment mechanism 126b may include an attachment bracket affixed to an upper portion of the lower vertical support member 122b and to a lower portion of the upper vertical support member 124b using screws, bolts (e.g., shipping bolts), nuts and bolts, welding, etc. In some embodiments, the lower vertical support member 122b and the upper vertical support member 124b may be attached to each other without a bracket 126b, e.g., via welding, bolts (e.g., shipping bolts), nuts and bolts, screws, etc. In some embodiments, the lower vertical support member 122b and the upper vertical support member 124b may be shaped to slideably engage within each other to increase and/or decrease the height of the portable rack dolly system 100. In some embodiments, the first post 102a and the second post 102b may be substantially identical. In some embodiments, the first post 102a and the second post 102b may be mirror images of each other.

For the first post 102a, each of the lower vertical support member 122a and the upper vertical support member 124a may have support rail attachment points 120a configured to affix one or more component support rails 112a. The attachment points 120a may include screw holes, holes for receiving bolts there-though, attachment clips, etc. The component support rails 112a may be configured to support devices such as system blades, telecommunications equipment, audio equipment, etc. Similarly, for the second post 102b, each of the lower vertical support member 122b and the upper vertical support member 124b may have support rail attachment points 120b configured to affix one or more component support rails 112 (not shown on the second post 102b). The attachment points 120b may include screw holes, holes for receiving bolts there-though, attachment clips, etc. As shown in FIG. 1, only the first post 102a has component support rails 112a, although it is possible for both the first post 102a and the second post 102b to have component support rails 112.

For the first post 102a, each of the lower vertical support member 122a and the upper vertical support member 124a may further include attachment points 128a (hidden by the first gusset bracket 116a) configured to affix the base 108 thereto. The attachment points 128a may include screw holes, holes for receiving bolts 134a (hidden by the first gusset bracket 116a) therethrough, attachment clips, etc. As shown, the base 108 is affixed to the lower attachment points 128a in the lower vertical support member 122a. The base 108 may include a platform, legs, and/or other bases. Similarly, for the second post 102b, each of the lower vertical support member 122b and the upper vertical support member 124b may further include attachment points 128b configured to affix the base 108 thereto. The attachment points 128b may include screw holes, holes for receiving bolts 134b therethrough, attachment clips, etc. As shown, the base 108 is affixed to lower attachment points 128a in the lower vertical support member 122a.

For the first post 102a, each of the lower vertical support member 122a and the upper vertical support member 124a may further include attachment points 130a (hidden due to the perspective view and hidden by bolt 132a, but in some embodiments including a mirror image of the attachment points 130b on the second post 102b) configured to affix the one or more top crossbars 104. The attachment points 130a may include screw holes, holes for receiving bolts 132a therethrough, attachment clips, etc. Similarly, for the second post 102b, each of the lower vertical support member 122b and the upper vertical support member 124b may further include attachment points 130b configured to affix the one or more top crossbars 104. The attachment points 130b may include screw holes, holes for receiving bolts 132b therethrough, attachment clips, etc. As shown, portable rack dolly system 100 includes two top crossbar members 104, namely, a first top crossbar member 104c positioned across the front of the first post 102a and the second post 102b, and a second top crossbar 104d positioned across the back of the first post 102a and the second post 102b. In the illustrated embodiment, only the upper vertical support members 124a and 124b include attachment points 130a and 130b. Although the one or more top crossbars 104 are shown positioned in the front and back of the first and second posts 102a and 102b, the one or more top crossbars 104 may be positioned alternatively or additionally in between the front and back of the first and second posts 102a and 102b.

For the first post 102a, each of the lower vertical support member 122a and the upper vertical support member 124a may further include one or more attachment points 136a (hidden due to the perspective view, but in some embodiments including a mirror image of the one or more attachment points 136b on the second post 102b) configured to affix the one or more intermediate crossbars 106. In the illustrated embodiment, only the lower portion of the upper vertical support member 124a includes the one or more attachment points 136a. Similarly, for the second post 102b, each of the lower vertical support member 122b and the upper vertical support member 124b may further include one or more attachment points 136b configured to affix the one or more intermediate crossbars 106. In the illustrated embodiment, only the lower portion of the upper vertical support member 124b includes the one or more attachment points 136b. The illustrated embodiment in FIG. 1 depicts only one intermediate crossbar 106 positioned in front of the lower portion of the upper vertical support member 124b. In some embodiments, the portable rack dolly system 100 may include additional intermediate crossbars 106, which may be positioned at various positions across the lower vertical support members 122a and 122b, or across the upper vertical support members 124a and 124b, whether positioned in front, in back, or in between.

In some embodiments, the first post 102a, the second post 102b, the one or more top crossbars 104, the one or more intermediate crossbars 106 and the base 108 form a device rack for supporting multiple system components, such as system blades, telecommunications equipment, audio equipment, etc.

A first handle assembly 114a may be coupled to the first post 102a. The first handle assembly 114a may include a first handle support rail 144a and a first handle 146a. In some embodiments, the first handle support rail 144a may include attachment points 140a configured to be coupled to attachment points 138a on the upper vertical support member 124a by an attachment mechanism 142a. In some embodiments, the attachment points 140a on the first handle support rail 144a and the attachment points 138a on the upper vertical support member 124a may include one or more holes, e.g., one or more screw holes or one or more holes to receive one or more bolts. In some embodiments, the attachment mechanism 142a may include screws, nuts and bolts, clips, etc. The first handle 146a may be affixed to an attachment point 148a at or near the distal end of the first handle support rail 144a. In some embodiments, the attachment point 148a in the first handle support rail 144a may include a screw hole to receive a screw formed in the end of the first handle 146a. In some embodiments, the first handle support rail 144a and the first handle 146a may be integrally formed or substantially permanently rotationally affixed to each other. Similarly, a second handle assembly 114b may be coupled to the second post 102b. The second handle assembly 114b may include a second handle support rail 144b and a second handle 146b. In some embodiments, the second handle support rail 144b may include attachment points 140b configured to be coupled to attachment points 138b on the upper vertical support member 124b by an attachment mechanism 142b. In some embodiments, the attachment points 140b on the second handle support rail 144b and the attachment points 138b on the upper vertical support member 124b may include one or more holes, e.g., one or more screw holes to receive one or more screws or one or more holes to receive one or more bolts. In some embodiments, the attachment mechanism 142a may include screws, nuts and bolts, clips, etc. The second handle 146b may be affixed to an attachment point 148b at or near the distal end of the second handle support rail 144b. In some embodiments, the attachment point 148b in the second handle support rail 144b may include a screw hole to receive a screw formed in the end of the second handle 146b. In some embodiments, the second handle support rail 144b and the second handle 146b may be integrally formed or substantially permanently rotationally affixed to each other.

Other handle assemblies may be used instead of or in addition to the first handle assembly 114a and the second handle assembly 114b. For example, the portable rack dolly system 100 may include a handle assembly with a centered single handle, where the handle assembly is coupled to at least one of the one or more top crossbars 104, coupled to the first post 102a and to the second post 102b, coupled to at least one of the one or more intermediate crossbars 106, etc. In some embodiments, the portable rack dolly system 100 may include no handle assembly, and the installer may grip at least one of the one or more top crossbars 104, or at least one of the one of the one or more intermediate crossbars 106. In some embodiments, one of the one or more top crossbars 104 or one of the one or more intermediate crossbars 106 may have a circular cross section for a more comfortable grip. In some embodiments, a rubber grip or rotating handle may be positioned on the one of the one or more top crossbars 104 or the one of the one or more intermediate crossbars 106. In some embodiments, there may be additional handle assemblies.

The first gusset bracket 116a may be coupled to the first post 102a. As shown, the first gusset bracket 116a is affixed to a low position, e.g., the lowest portion, of the lower vertical support member 122a. In some embodiments, attachment points 162a in the first gusset bracket 116a are coupled to attachment points 160a in the first post 102a by an attachment mechanism 164a. In some embodiments, the attachment points 162a on the first gusset bracket 116a and the attachment points 160a on the lower vertical support member 122a may include one or more holes, e.g., one or more screw holes or one or more holes to receive one or more bolts. In some embodiments, the attachment mechanism 164a may include screws, bolts (e.g., shipping bolts), nuts and bolts, clips, etc. Similarly, the second gusset bracket 116b may be coupled to the second post 102b. As shown, the second gusset bracket 116b is affixed to a low position, e.g., the lowest portion, of the lower vertical support member 122b. In some embodiments, attachment points 162b in the second gusset bracket 116b are coupled to attachment points 160b in the second post 102b by an attachment mechanism 164b. In some embodiments, the attachment points 162b on the second gusset bracket 116b and the attachment points 160b on the lower vertical support member 122b may include one or more holes, e.g., one or more screw holes or one or more holes to receive one or more bolts. In some embodiments, the attachment mechanism 164b may include screws, bolts (e.g., shipping bolts), nuts and bolts, clips, etc.

In some embodiments, the first gusset bracket 116a may be coupled to a first side of the base 108 instead of or in addition to being coupled to the first post 102a, and the second gusset bracket 116b may be coupled to a second side of the base 108 instead of or in addition to being coupled to the second post 102b. In some embodiments, the first gusset bracket 116a may be coupled to a first side of the device rack at a first low position, and the second gusset bracket 116b may be coupled to a second side of the device rack at a second low position. In some embodiments, the low-ness of the positions are defined by the radius of the wheels 154a and 154b and the dimensions and positions of the open slots 150a and 150b.

The first gusset bracket 116a includes a first open slot 150a. The second gusset bracket 116b includes a second open slot 150b. The first gusset bracket 116a and the second gusset bracket 116b may be configured to ensure that the distance between the first open slot 150a and the second open slot 150b achieve a predetermined distance therebetween when the first gusset bracket 116a is affixed to the first post 102a and the second gusset bracket 116b is affixed to the second post 102b. The first open slot 150a and the second open slot 150b may include similar or identical shapes. As shown, each of the first open slot 150a and the second open slot 150b may have a downwardly diagonal portion beginning at an open end and a substantially horizontal portion at the terminal end. Notably, the directions refer to directions of the first open slot 150a and the second open slot 150b when the first gusset bracket 116a and the second gusset bracket 116b are affixed to the device rack, and the device rack is in its generally upright position. The width of the first open slot 150a and the second open slot 150b may be substantially consistent and substantially identical.

The wheel assembly 118 may include a wheel shaft 152. A first wheel 154a may be rotationally coupled to a first end of the wheel shaft 152. A second wheel 154b may be rotationally coupled to a second end of the wheel shaft 152. In some embodiments, the wheel shaft 152 may include a first groove 156a (hidden in the perspective view) and a second groove 156b, and the distance between the grooves 156a and 156b may be the same or almost the same as the predetermined distance between the first open slot 150a and the second open slot 150b. The diameters of the grooves 156a and 156b may be substantially the same as the widths of the first open slot 150a and the second open slot 150b, respectively. The ground-to-open-end height of the first open slot 150a and of the second open slot 150b may be configured based on the height of the shaft 152 when the first wheel 154a and the second wheel 154b are mounted thereon (which is substantially the same as the radius of the wheels 154a and 154b). Alternatively, the radius of the first wheel 154a and of the second wheel 154b may be configured based on the ground-to-open-end height of the first open slot 150a and of the second open slot 150b when affixed to the device rack. Further, the ground-to-terminal-end height of the first open slot 150a and the second open slot 150b may be configured based on the radius of the wheels 154a and 154b to ensure that the wheels 154a and 154b raise the portable rack dolly system 100 at least when tilted rearwards (backwards) without the base 108 interfering.

After mounting the first handle assembly 114a, the second handle assembly 114b, the first gusset bracket 116a, and the second gusset bracket 116b, the installer can roll the wheel assembly 118 towards the first open slot 150a and the second open slot 150b so that the first groove 156a and the second groove 156b align with the first open slot 150a and the second open slot 150b. The installer can hold the handles and tip the portable rack dolly system 100 forwards (raising the gusset brackets), thereby allowing the wheel shaft 152 to slide down the diagonal portion of first open slot 150a and of the second open slot 150b. Then, the installer can tip the portable rack dolly system 100 backwards (lowering the gusset brackets), towards himself, thereby allowing the wheel shaft 152 to slide into the horizontal portions of the first open slot 150a and the second open slot 150b until the wheel shaft 152 reaches the terminal ends of the first open slot 150a and the second open slot 150b. The installer can push or pull the portable rack dolly system 100 while the weight of the portable rack dolly system 100 is substantially borne by the wheel assembly 118 and while the wheels 154 rotate making movement easier.

After the installer positions the portably rack dolly system 100, the installer can tilt the portable rack dolly system 100 forward until the wheel assembly 118 is raised above the ground. The installer can use his foot or other technique to withdraw the wheel assembly 118 from the first open slot 150a and the second open slot 150b. Then, the installer can tilt the portable rack dolly system 100 back down until the base 108 is flat on the ground and stable in place.

It will be appreciated that other slot shapes are also possible. For example, the slot shape may begin with a horizontal portion, continue to a downward portion, and then continue to a horizontal and/or upwardly diagonal portion. Each portion may be straight or curved. Generally, the slot shape should include a receiving portion (which may be the initial slot opening) that receives the wheel shaft 118, a delivery portion that delivers the wheel shaft 118 downward upon a tilting forward, and a locking portion to secure the wheel shaft 118 upon a subsequent tilting backward. As stated above, the directions refer to directions when the first gusset bracket 116a and the second gusset bracket 116b are affixed to the device rack, and the device rack is in its generally upright position.

Figure 1B:
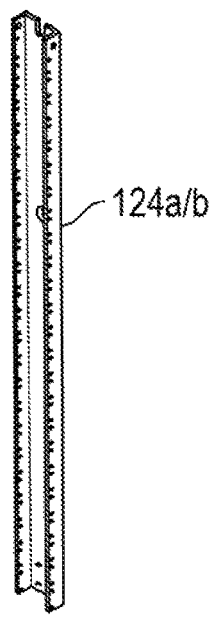
FIG. 1B depicts an upper vertical support member, in accordance with an embodiment of the present invention.

FIG. 1B depicts an upper vertical support member 124a/124b, in accordance with an embodiment of the present invention.

Figure 1C:
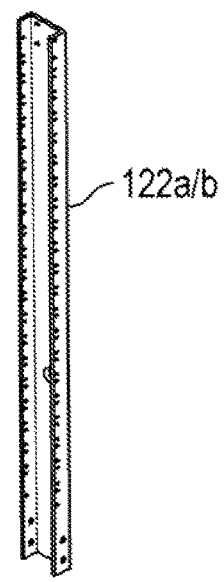
FIG. 1C depicts a lower vertical support member, in accordance with an embodiment of the present invention.

FIG. 1C depicts a lower vertical support member 122a/122b, in accordance with an embodiment of the present invention.

Figure 1D:
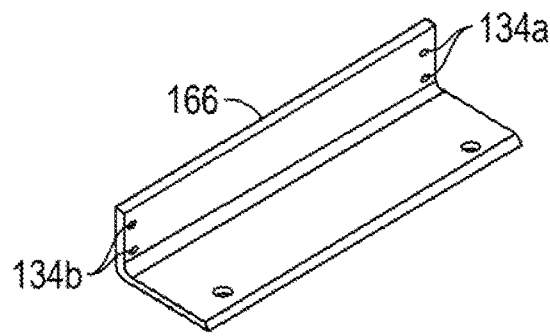
FIG. 1D depicts a base plate, in accordance with an embodiment of the present invention.

FIG. 1D depicts a base plate 166, in accordance with an embodiment of the present invention. The base 108 may be formed using a first instance of the base plate 166 positioned in front and across the first lower vertical support member 122a and the second lower vertical support member 122b, and a second instance of the base plate 166 positioned in back and across the first lower vertical support member 122a and the second lower vertical support member 122b.

Figure 1E:
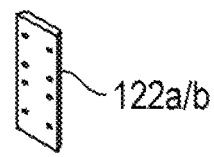
FIG. 1E depicts an attachment bracket, in accordance with an embodiment of the present invention.

FIG. 1E depicts an attachment bracket 126a/126b, in accordance with an embodiment of the present invention. The attachment bracket 126a/126b may be used to conjoin the first lower vertical support member 122a to the first upper vertical support member 124a, and to conjoin the second lower vertical support member 122b to the second upper vertical support member 124b.

Figure 1F:
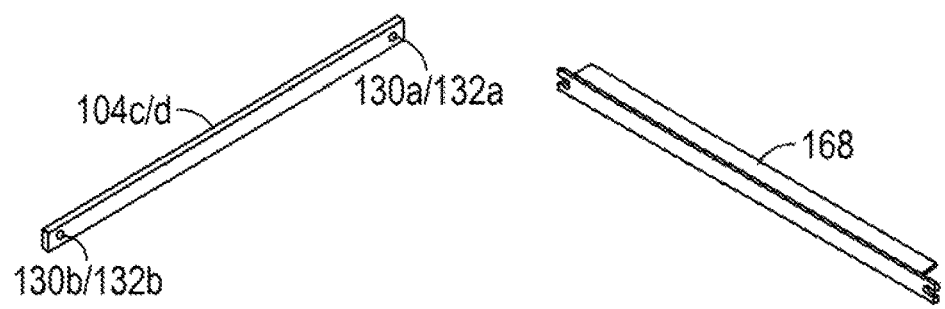
FIG. 1F depicts a top crossbar, in accordance with an embodiment of the present invention.

FIG. 1F depicts a top crossbar 104c/104d, in accordance with an embodiment of the present invention.

Figure 1G:
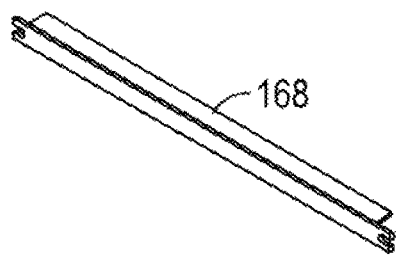
FIG. 1G depicts an intermediate crossbar, in accordance with an embodiment of the present invention.

FIG. 1G depicts an intermediate crossbar 168, in accordance with an embodiment of the present invention. Intermediate crossbar 106 may be the intermediate crossbar 168.

Figure 1H:
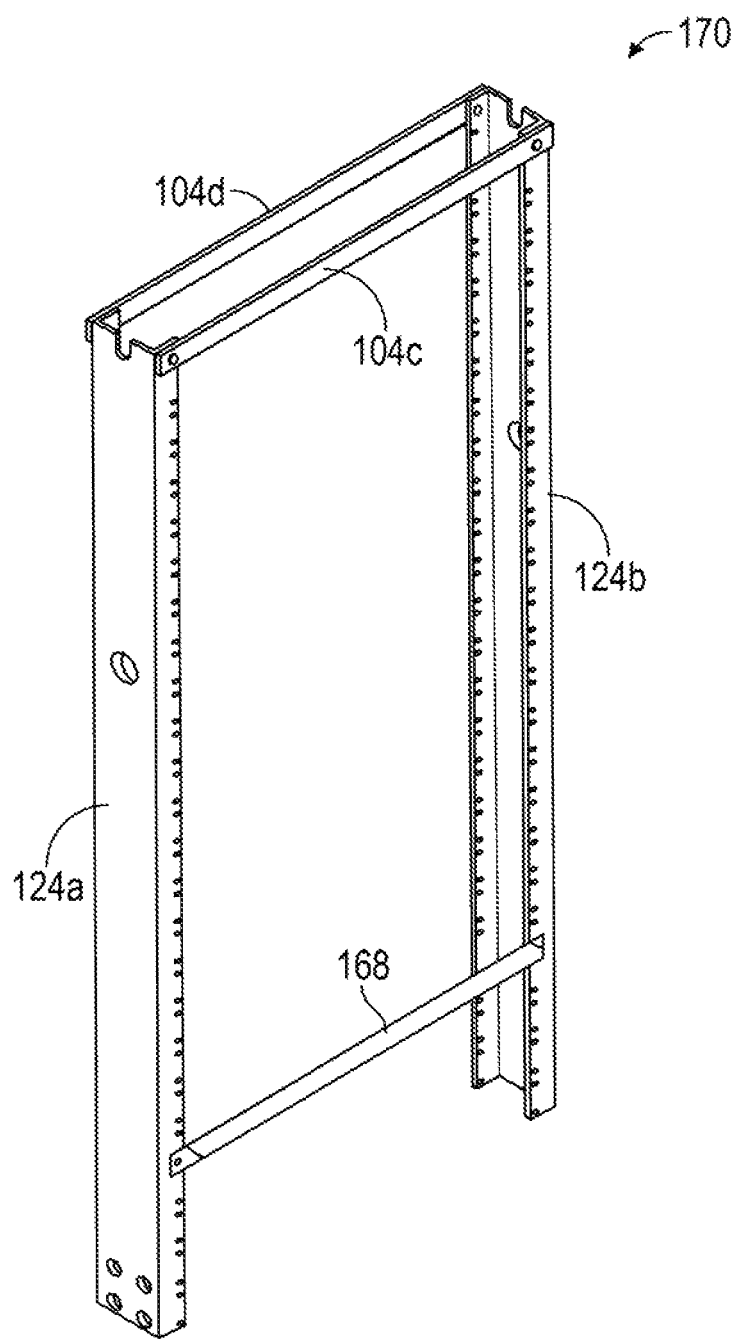
FIG. 1H depicts an upper rack section, in accordance with an embodiment of the present invention.

FIG. 1H depicts an upper rack section 170, in accordance with an embodiment of the present invention. As shown, the upper rack section 170 is similar to the upper rack section of the portable rack dolly system 100. The upper rack section 170 includes first upper vertical support member 124a, second upper vertical support member 124b, a first top crossbar 104c coupled across and in front of the first upper vertical support member 124a and second upper vertical support member 124b, a second top crossbar 104d coupled across and in back of the first upper vertical support member 124a and the second upper vertical support member 124b, and an intermediate crossbar 168 coupled across the lower portion and in front of the first upper vertical support member 124a and the second upper vertical support member 124b.

Figure 1I:
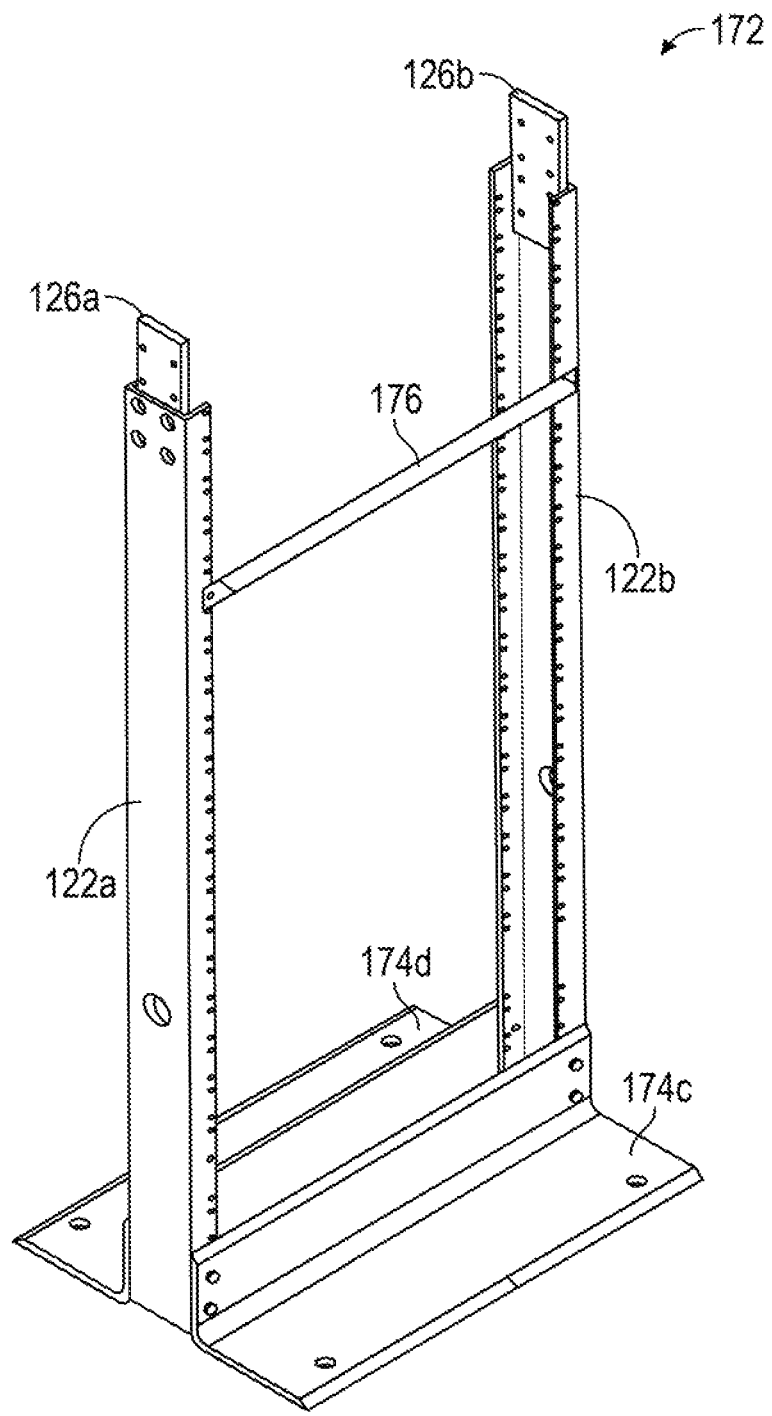
FIG. 1I depicts a lower rack section, in accordance with an embodiment of the present invention.

FIG. 1I depicts a lower rack section 172, in accordance with an embodiment of the present invention. As shown, the lower rack section 172 is similar to the lower rack section of the portable rack dolly system 100. The lower rack section 172 includes first lower vertical support member 122a, second lower vertical support member 122b, a first base plate 174c coupled across and in front of the lower portion of the first lower vertical support member 122a and the second lower vertical support member 122b, a second base plate 174d coupled across and in back of the lower portion of the first lower vertical support member 122a and the second lower vertical support member 122b, and an intermediate crossbar 176 coupled across the upper portion and in front of the first lower vertical support member 122a and the second lower vertical support member 122b. The first attachment bracket 126a and the second attachment bracket 126b may be coupled to the inside of the upper portion of the first lower vertical support member 122a and to the inside of the upper portion of the second lower vertical support member 122b, respectively.

In some embodiments, the upper rack section 170 and the lower rack section 172 may be assembled, packaged, and shipped to the installation premise for assembly. In some embodiments, the devices may be attached to one or both of the upper rack section 170 and the lower rack section 172 before shipping to the installation premise. In some embodiments, by using the device rack described herein and by dividing the device rack into two sections, the device rack sections and devices can be sent to the installation premise in 48" packaging instead of in a 7'6" wide crate. In some embodiments, the crate can be designed with lighter recyclable materials. The shipping/freight cost rate will go down. In some embodiments, device assemblers can work at eye level, rather than standing on boxes to position devices 7' above the base. In some embodiments, a single installer can unpack and assemble the device rack. In some embodiments, assemblers and installers will not need forklifts or pallet jacks.

Figure 1J:
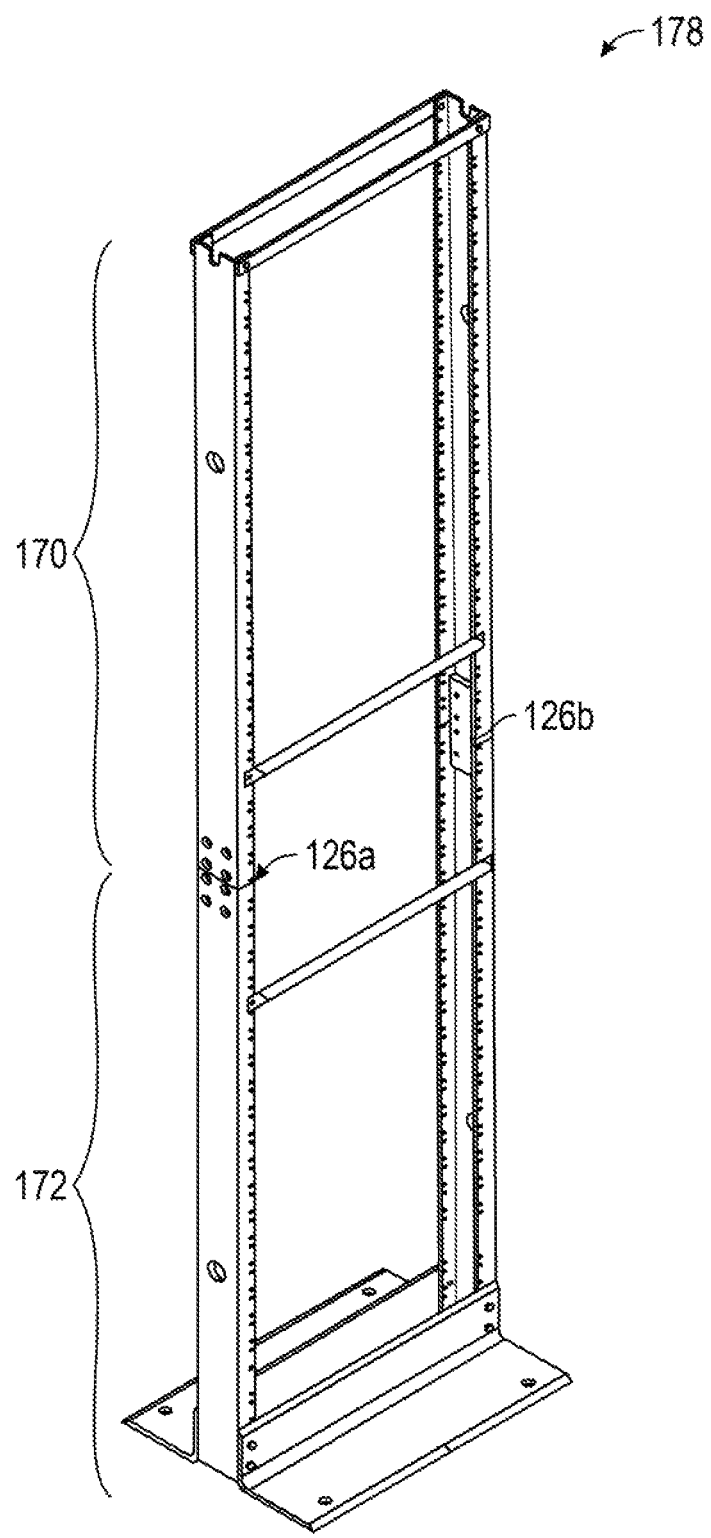
FIG. 1J depicts a device rack, in accordance with an embodiment of the present invention.

FIG. 1J depicts a device rack 178, in accordance with an embodiment of the present invention. As shown, the device rack 178 includes the upper rack section 170 coupled to the lower rack section 172 by the attachment brackets 126a and 126b.

Figure 1K:
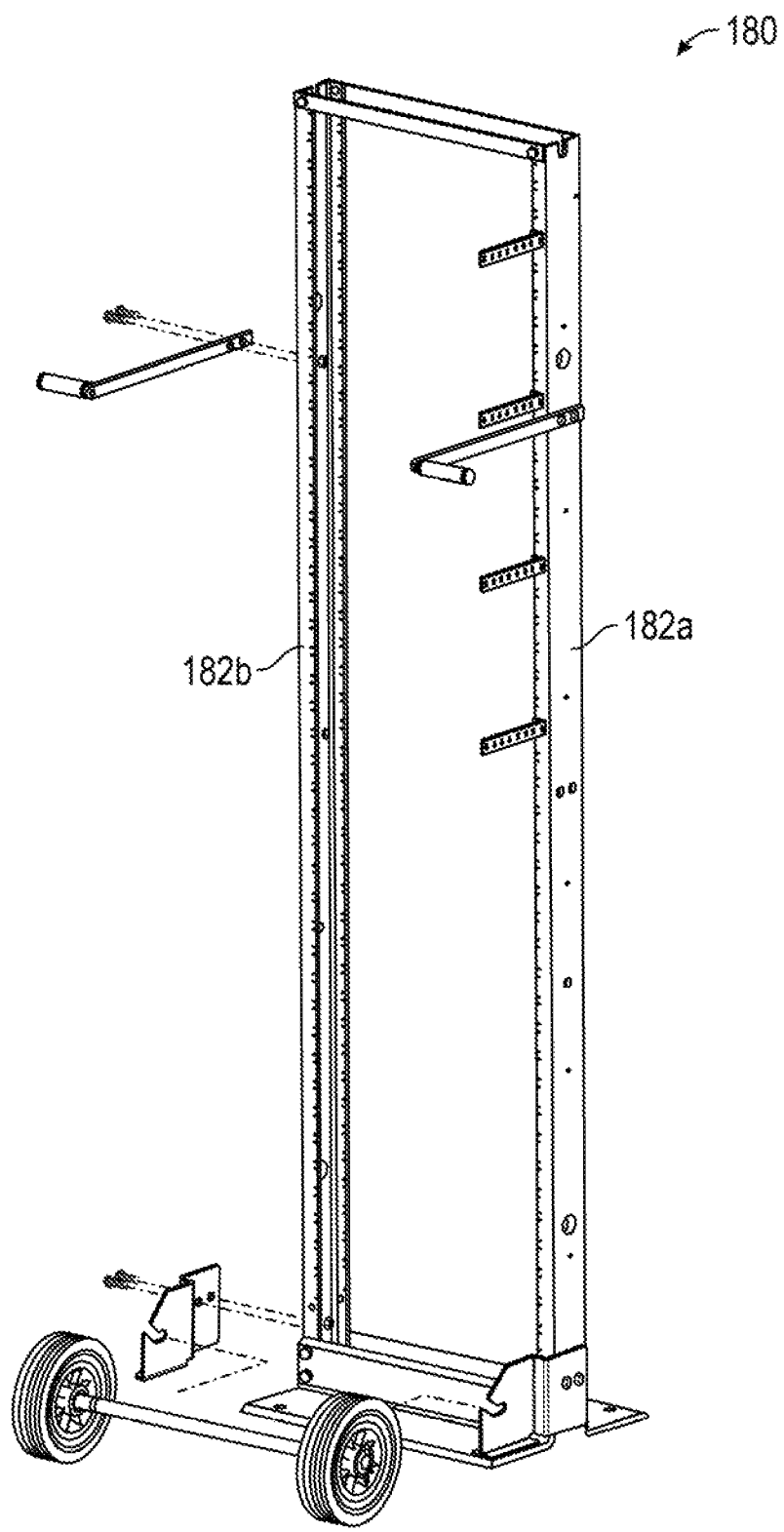
FIG. 1K depicts a portable rack dolly system, in accordance with an embodiment of the present invention.

FIG. 1K depicts a portable rack dolly system 180, in accordance with an embodiment of the present invention. The portable rack dolly system 180 is similar to the portable rack dolly system 100, except (1) that the first upper vertical support member 124a coupled to the first lower vertical support member 122a are replaced by a first integral vertical support member 182a, (2) the second upper vertical support member 124b coupled to the second lower vertical support member 122b are replaced by a second integral vertical support member 182b, and (3) there is no intermediate crossbar 106 (although one or more intermediate crossbars can be included).

Figure 2:
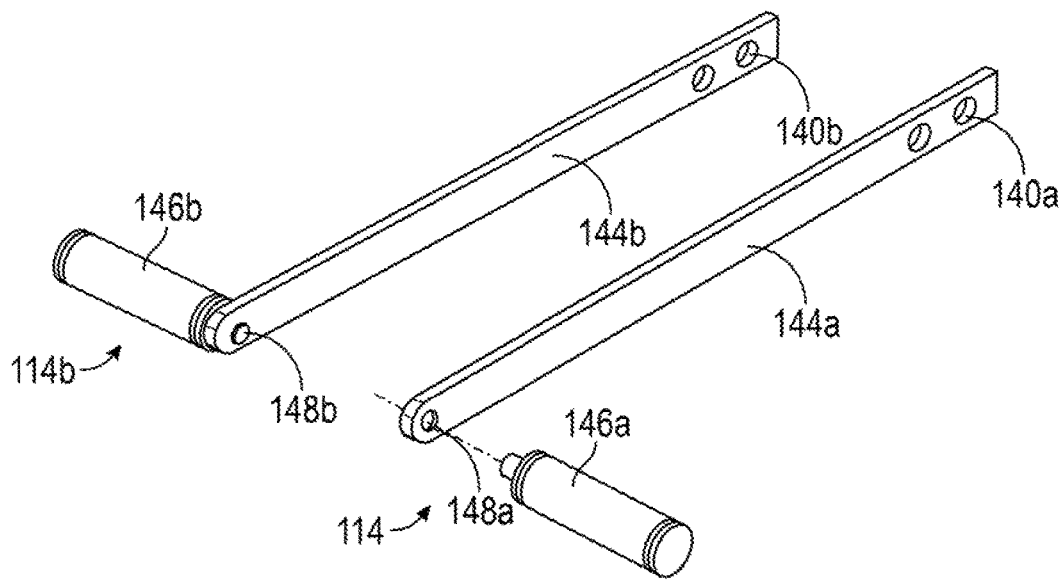
FIG. 2 depicts a handle assembly, in accordance with an embodiment of the present invention.

FIG. 2 depicts the first and second handle assemblies 114a and 114b, in accordance with an embodiment of the present invention. As shown, the first handle assembly 114a includes the first handle support rail 144a and the first handle 146a. The first handle support rail 144a includes attachment points 140a configured to be coupled to attachment points 138a on the upper vertical support member 124a by an attachment mechanism 142a. The attachment points 140a on the first handle support rail 144a include one or more holes, e.g., one or more screw holes or one or more holes to receive one or more bolts. The first handle 146a is affixed to the attachment point 148a at or near the distal end of the first handle support rail 144a. In some embodiments, the attachment point 148a in the first handle support rail 144a may include a screw hole to receive a screw formed in the end of the first handle 146a. In some embodiments, the first handle support rail 144a and the first handle 146a may be integrally formed or substantially permanently rotationally affixed to each other. Similarly, the second handle assembly 114b includes the second handle support rail 144b and the second handle 146b. The second handle support rail 144b includes the attachment points 140b configured to be coupled to the attachment points 138b on the upper vertical support member 124b by an attachment mechanism 142b. The attachment points 140b on the second handle support rail 144b include one or more holes, e.g., one or more screw holes to receive one or more screws or one or more holes to receive one or more bolts. The second handle 146b may be affixed to an attachment point 148b at or near the distal end of the second handle support rail 144b. In some embodiments, the attachment point 148b in the second handle support rail 144b may include a screw hole to receive a screw formed in the end of the second handle 146b. In some embodiments, the second handle support rail 144b and the second handle 146b may be integrally formed or substantially permanently rotationally affixed to each other.

Figure 3:
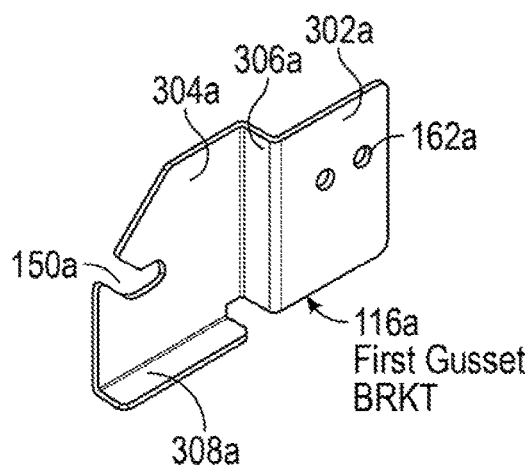
FIG. 3 depicts a first gusset bracket, in accordance with an embodiment of the present invention.

FIG. 3 depicts a first gusset bracket 116a, in accordance with an embodiment of the present invention. As shown, the first gusset bracket 116a includes a post-coupling portion 302a, coupled to a return portion 306a, coupled to a wheel-coupling portion 304a, and coupled to a base portion 308a. The post-coupling portion 302a includes the attachment points 162a, which may include one or more holes, e.g., one or more screw holes or one or more holes to receive one or more bolts. The wheel-coupling portion 304a includes the first open slot 150a. The first open slot 150a has a downwardly diagonal portion beginning at an open end and a substantially horizontal portion at the terminal end. The width of the first open slot 150a is substantially consistent. The length of return portion 306a may be configured to ensure that the distance between the grooves 156a and 156b is the same or almost the same as the predetermined distance between the first open slot 150a and the second open slot 150b when mounted to the first post 102a and the second post 102b respectively. The base portion 308a is configured to rest on the base 108.

Figure 4:
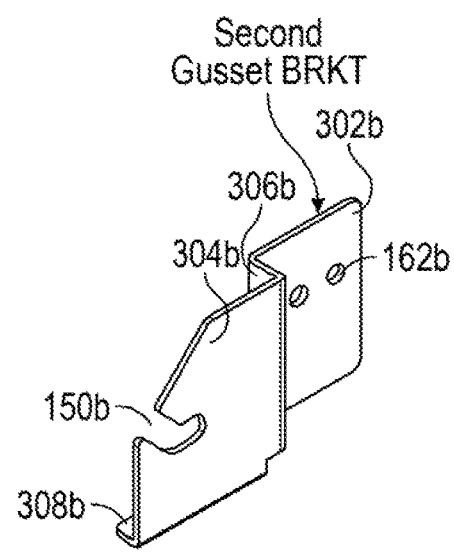
FIG. 4 depicts a second gusset bracket, in accordance with an embodiment of the present invention.

FIG. 4 depicts a second gusset bracket 116b, in accordance with an embodiment of the present invention. As shown, the second gusset bracket 116b includes a post-coupling portion 302b, coupled to a return portion 306b, coupled to a wheel-coupling portion 304b, and coupled to a base portion 308b. The post-coupling portion 302b includes the attachment points 162b, which may include one or more holes, e.g., one or more screw holes or one or more holes to receive one or more bolts. The wheel-coupling portion 304b includes the second open slot 150b. The second open slot 150b has a downwardly diagonal portion beginning at an open end and a substantially horizontal portion at the terminal end. The width of the second open slot 150b is substantially consistent. The length of return portion 306b may be configured to ensure that the distance between the grooves 156a and 156b is the same or almost the same as the predetermined distance between the first open slot 150a and the second open slot 150b when mounted to the first post 102a and the second post 102b respectively. The base portion 308b is configured to rest on the base 108.

Figure 5:
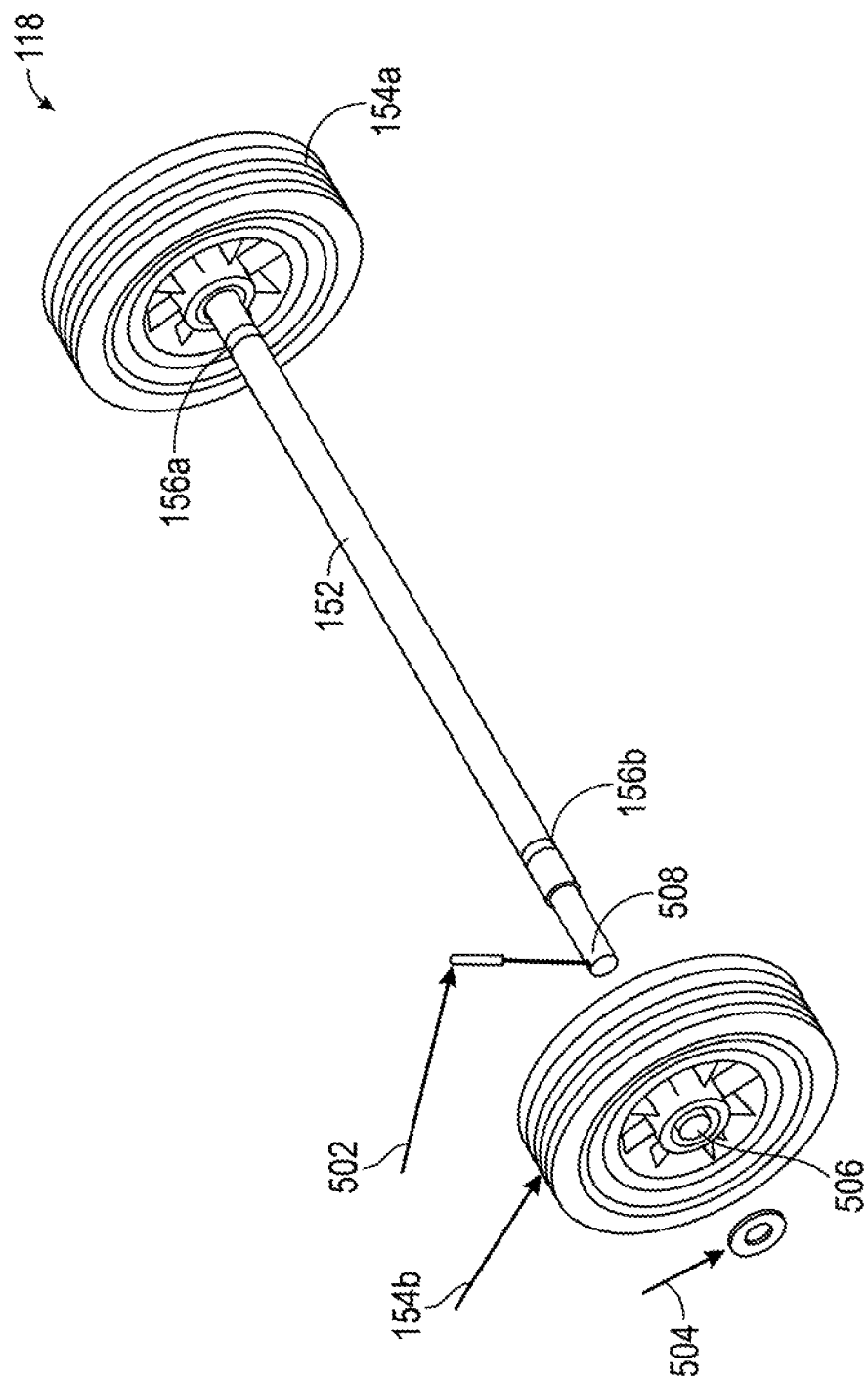
FIG. 5 depicts a wheel assembly, in accordance with an embodiment of the present invention.

FIG. 5 depicts the wheel assembly 118, in accordance with an embodiment of the present invention. As shown, the wheel assembly 118 includes the wheel shaft 152. The first wheel 154a is rotationally coupled to a first end of the wheel shaft 152. The second wheel 154b is rotationally coupled to a second end of the wheel shaft 152. The wheel shaft 152 includes the first groove 156a and the second groove 156b. The distance between the grooves 156a and 156b may be the same or almost the same as the distance between the first open slot 150a and the second open slot 150b when mounted to the first post 102a and the second post 102b respectively. The diameters of the grooves 156a and 156b may be substantially the same as the widths of the first open slot 150a and the second open slot 150b, respectively. The wheel assembly 118 may be stored in a disassembled state, such that the wheels 154a and 154b are kept separate from the wheel shaft 152. The wheel assembly 118 may be assembled when needed. As shown, the wheels 154a and 154b may be rotationally coupled to each other inserting the wheel shaft 152 into a central bore 506 in the wheels 154a and 154b. A washer 504 may be slid onto the exposed portion of the wheel shaft 152, and a pin or clip may be slid into a locking bore 508 in the wheel shaft 152. Other mechanisms may be used to rotationally couple the wheels 154a and 154b to the wheel shaft 152.

Figure 6:
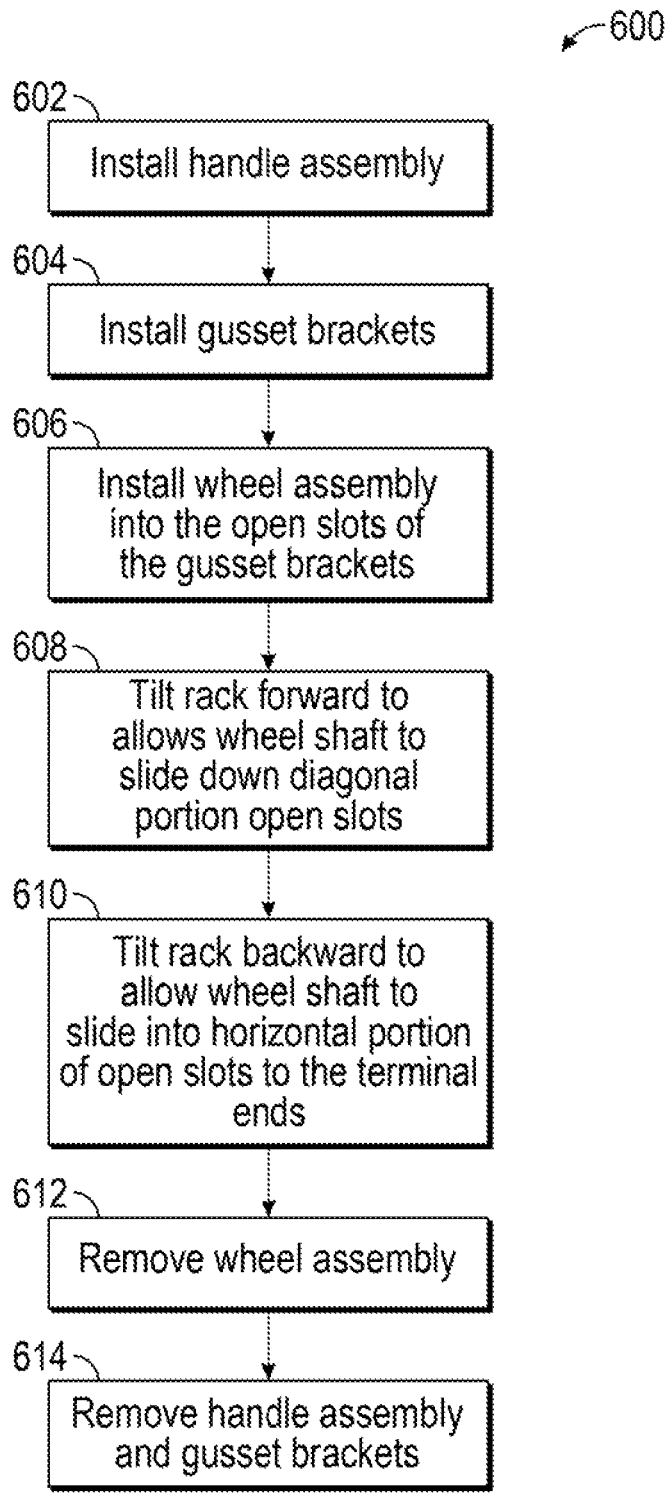
FIG. 6 is a flowchart illustrating a method of retrofitting a pre-existing device rack, in accordance with an embodiment of the present invention.

FIG. 6 is a flowchart illustrating a method 500 of retrofitting, upgrading and/or modifying a device rack, in accordance with an embodiment of the present invention. In some embodiments, the first handle assembly 114a, the second handle assembly 114b, the first gusset bracket 116a, and the second gusset bracket 116b may be affixed to a pre-existing device rack. The installation height of the first and second gusset brackets 116a and 116b may be selected based on the height of the wheel shaft 152 of the wheel assembly 118.

In step 602, a handle assembly is affixed to the device rack. In some embodiments, the handle assembly may include the first handle assembly 114a and the second handle assembly 114b, which may be attached to the first post 102a and the second post 102b, respectively. The first handle assembly 114a may be attached to the first post 102a using screws, bolts, or nuts and bolts. The second handle assembly 114b may be attached to the second post 102b using screws, bolts, or nuts and bolts.

In step 604, gusset brackets are affixed to the device rack. In some embodiments, the gusset brackets may include the first gusset bracket 116a and the second gusset bracket 116b, which may be attached to the first post 102a and the second post 102b, respectively. The first gusset bracket 116a may be attached to the first post 102a using screws, bolts, or nuts and bolts. The second gusset bracket 116b may be attached to the second post 102b using screws, bolts, or nuts and bolts.

In step 606, a wheel assembly is installed into the open slots of the gusset brackets. In some embodiments, the wheel assembly includes wheel assembly 118, which includes wheels 154a and 154b and wheel shaft 152, and the gusset brackets include gusset brackets 116a and 116b. The wheel shaft 152 may be positioned into the first open slot 150a of the first gusset bracket 116a and the second open slot 150b of the second gusset bracket 116b. In some embodiments, the wheel assembly 118 can be positioned so that the first open slot 150a and the second open slot 150b align with the first groove 156a and the second groove 156b.

In step 608, the device rack with the installed handle assembly and gusset brackets is tilted forwards to allow the wheel assembly to engage with the gusset brackets. In some embodiments, such as the embodiment shown in FIG. 1, the installer can use the handle assembly to tip the device rack forward, thereby allowing the wheel shaft 152 to slide into the diagonal portion of the first open slot 150a and of the second open slot 150b.

In step 610, the device rack with the installed handle assembly and gusset brackets is tilted backwards to allow the wheel assembly to fully engage with the gusset brackets. In some embodiments, such as the embodiment FIG. 1, the installer can use the handle assembly to tip the device rack backwards, towards himself, thereby allowing the wheel shaft 152 to slide into the horizontal portions of the first open slot 150a and the second open slot 150b until the wheel shaft 152 reaches the terminal ends of the first open slot 150a and the second open slot 150b. From this tilted position, the installer can push or pull the portable rack dolly system 100 while the weight of the portable rack dolly system 100 is substantially borne by the wheel assembly 118 and while the wheels 154 rotate making movement easier.

In step 612, the wheel assembly is removed from the device rack. In some embodiments, such as the embodiment shown in FIG. 1, removing the wheel assembly 118 can be completed using the first handle assembly 114a and/or the second handle assembly 114b to tilt the device rack forwards until the wheels 154a and 154b have been raised above ground. The installer can use his foot or other technique to withdraw the wheel assembly 118 from the first open slot 150a and the second open slot 150b. Then, the installer can tilt the portable rack dolly system 100 back down until the base 108 is flat on the ground and stable in place.

In step 614, the handle assembly and the gusset brackets are removed from the device rack. In some embodiments, such as the embodiment shown in FIG. 1, removing the first handle assembly 114a and the second handle assembly 114b, and removing the first gusset bracket 116a and the second gusset bracket 116b may be effected by removing the attachment mechanisms (such as the screws, bolts, or nuts and bolts). In some embodiments, the handle assembly and the gusset brackets may be left on the device rack, and only the wheel assembly is removed. In some embodiments, the gusset brackets may be left on the device rack, and the wheel assembly and the handle assembly are removed. Other methods are possible.

The invention claimed is:

1. A system configured to modify a device rack into a portable rack dolly, comprising:
    a wheel assembly, the wheel assembly including a wheel shaft, a first wheel rotationally coupled to the wheel shaft, and a second wheel rotationally coupled to the wheel shaft, the wheel shaft including a first shaft position and a second shaft position;
    a first bracket configured to be coupled to a device rack on a first side at a first low position, the first bracket including a first open slot configured to cooperate with the first shaft position on the wheel shaft, the first open slot including a first receiving portion configured to receive the wheel shaft at the first shaft position, a first delivery portion configured to deliver the wheel shaft upon tilting the device rack forwards, and a first locking portion configured to secure the wheel shaft upon tilting the device rack backwards;
    a second bracket configured to be coupled to the device rack on a second side at a second low position, the second bracket including a second open slot configured to cooperate with the second shaft position on the wheel shaft, the second open slot including a second receiving portion configured to receive the wheel shaft at the second shaft position, a second delivery portion configured to deliver the wheel shaft upon tilting the device rack forwards, and a second locking portion configured to secure the wheel shaft upon tilting the device rack backward; and
    a handle assembly coupled to the device rack, the handle assembly configured to support tilting the device rack forwards and backwards.

2. The system of claim 1, wherein the wheel shaft includes a first groove at the first shaft position configured to engage with the first open slot, and a second groove at the second shaft position configured to engage with the second open slot.

3. The system of claim 2, wherein a distance between the first groove and the second groove is the same as a distance between the first bracket and the second bracket when affixed to the device rack.

4. The system of claim 1, wherein each of the first receiving portion and the second receiving portion includes an initial portion of the first open slot and the second open slot, respectively.

5. The system of claim 1, wherein each of the first delivery portion and the second delivery portion includes a downwardly angled portion configured to allow gravity to drop the wheel shaft downward as the device rack is tilted forwards.

6. The system of claim 5, wherein the downwardly angled portion includes a curved portion.

7. The system of claim 1, wherein each of the first locking portion and the second locking portion includes a horizontal or upwardly angled portion configured to allow weight of the device rack to secure the wheel shaft as the device rack is tilted backwards.

8. The system of claim 7, wherein the horizontal or upwardly angled portion includes a curved portion.

9. The system of claim 1, wherein the handle assembly includes a first handle assembly attached to a first post and a second handle assembly attached to a second post.

10. The system of claim 1, wherein the device rack includes telecommunication equipment.

11. The system of claim 1, wherein a height of the first receiving portion and the second receiving portion is about the same as a height of the wheel shaft.

12. The system of claim 1, wherein the first bracket includes a first gusset bracket and the second bracket includes a second gusset bracket.

13. A portable rack dolly system, comprising:
    a device rack including
        a first post having a top end and a bottom end;
        a second post having a top end and a bottom end;
        a first crossbar attached across the first post and the second post; and
        a base attached to the bottom end of the first post and the bottom end of the second post, the base configured to maintain the device rack in a stable upright position;
    a wheel assembly, the wheel assembly including a wheel shaft, a first wheel rotationally coupled to the wheel shaft, and a second wheel rotationally coupled to the wheel shaft, the wheel shaft including a first shaft position and a second shaft position;
    a first bracket configured to be coupled to the device rack on a first side at a first low position, the first bracket including a first open slot configured to cooperate with the first shaft position on the wheel shaft, the first open slot including a first receiving portion configured to receive the wheel shaft at the first shaft position, a first delivery portion configured to deliver the wheel shaft upon tilting the device rack forwards, and a first locking portion configured to secure the wheel shaft upon tilting the device rack backwards;
    a second bracket configured to be coupled to the device rack on a second side at a second low position, the second bracket including a second open slot configured to cooperate with the second shaft position on the wheel shaft, the second open slot including a second receiving portion configured to receive the wheel shaft at the second shaft position, a second delivery portion configured to deliver the wheel shaft upon tilting the device rack forwards, and a second locking portion configured to secure the wheel shaft upon tilting the device rack backwards; and
    a handle assembly coupled to the device rack, the handle assembly configured to support tilting the device rack forwards and backwards.

14. The portable rack dolly system of claim 13, wherein the wheel shaft includes a first groove at the first shaft position configured to engage with the first open slot, and a second groove at the second shaft position configured to engage with the second open slot.

15. The portable rack dolly system of claim 13, wherein each of the first delivery portion and the second delivery portion includes a downwardly angled portion configured to allow gravity to drop the wheel shaft downward as the device rack is tilted forwards.

16. The portable rack dolly system of claim 13, wherein each of the first locking portion and the second locking portion includes a horizontal or upwardly angled portion configured to allow weight of the device rack to secure the wheel shaft as the device rack is tilted backwards.

17. The portable rack dolly system of claim 13, wherein the handle assembly includes a first handle assembly attached to the first post and a second handle assembly attached to the second post.

18. The portable rack dolly system of claim 13, wherein a height of the first receiving portion and the second receiving portion is about the same as a height of the wheel shaft.

* * * * *